United States Patent
Lambert et al.

(10) Patent No.: US 9,992,871 B2
(45) Date of Patent: Jun. 5, 2018

(54) SYSTEMS AND METHODS FOR CONTROLLED EFFECTIVE SERIES RESISTANCE COMPONENT

(71) Applicant: Intel Corporation, Santa Clara, CA (US)

(72) Inventors: William J. Lambert, Chandler, AZ (US); Mathew J Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/937,047

(22) Filed: Nov. 10, 2015

(65) Prior Publication Data

US 2017/0135211 A1  May 11, 2017

(51) Int. Cl.
| | |
|---|---|
| *H05K 1/16* | (2006.01) |
| *H05K 1/11* | (2006.01) |
| *H05K 1/18* | (2006.01) |
| *H05K 3/00* | (2006.01) |
| *H05K 3/32* | (2006.01) |
| *H05K 3/40* | (2006.01) |

(52) U.S. Cl.
CPC ............. *H05K 1/116* (2013.01); *H05K 1/181* (2013.01); *H05K 3/0047* (2013.01); *H05K 3/32* (2013.01); *H05K 3/4084* (2013.01); H05K 2201/0329 (2013.01); H05K 2201/0391 (2013.01); H05K 2201/0776 (2013.01); H05K 2201/09627 (2013.01); H05K 2201/10015 (2013.01); H05K 2203/14 (2013.01)

(58) Field of Classification Search
CPC ...... H05K 1/116; H05K 1/181; H05K 3/0047; H05K 3/32; H05K 3/4084
USPC ........ 174/260, 250, 251, 255–259, 261, 262
See application file for complete search history.

(56) References Cited

U.S. PATENT DOCUMENTS

| | | |
|---|---|---|
| 2008/0273311 A1 | 11/2008 | Biunno |
| 2008/0310076 A1 | 12/2008 | Ritter et al. |
| 2010/0065942 A1 | 3/2010 | Lin et al. |
| 2011/0100691 A1 | 5/2011 | Yugawa |
| 2015/0371960 A1* | 12/2015 | Yap .................. H01L 23/66 257/659 |

(Continued)

FOREIGN PATENT DOCUMENTS

JP    2010162606 A    7/2010

OTHER PUBLICATIONS

"International Application Serial No. PCT/US2016/053057, International Search Report dated Dec. 28, 2016", 3 pgs.

(Continued)

*Primary Examiner* — Tremesha S Willis
(74) *Attorney, Agent, or Firm* — Schwegman Lundberg & Woessner, P.A.

(57) ABSTRACT

Discussed generally herein are methods and devices for altering an effective series resistance (ESR) of a component. A device can include a substrate including electrical connection circuitry therein, a first via hole through a first surface of the substrate and contiguous with the electrical connection circuitry, a first conductive polymer with a resistance greater than a resistance of the electrical connection circuitry filling the first via hole, and a component electrically coupled to the first conductive polymer.

13 Claims, 6 Drawing Sheets

(56) References Cited

U.S. PATENT DOCUMENTS

2016/0183372 A1* 6/2016 Park ................... H05K 1/0292
174/262

OTHER PUBLICATIONS

"International Application Serial No. PCT/US2016/053057, Written Opinion dated Dec. 28, 2016", 8 pgs.

* cited by examiner

SYSTEMS AND METHODS FOR CONTROLLED EFFECTIVE SERIES RESISTANCE COMPONENT

TECHNICAL FIELD

This disclosure relates generally to components with controlled effective series resistance (ESR).

BACKGROUND ART

Many commonly manufactured component have relatively low ESR. For example, ceramic capacitors have relatively low ESR as compared to electrolytic capacitors, tantalum capacitors, film capacitors, and others. In some applications, such as power delivery applications, using the lower ESR components can lead to an underdamped response to a load transient (i.e. "ringing" of the output voltage). This can be due to, at least in part, the lightly damped resonant circuit formed by inductive power delivery routing and decoupling components, such as capacitors or inductors. Some simulations have shown that artificially increasing the ESR of the decoupling components can result in significantly smaller voltage drops in some cases, thus creating a demand for higher ESR components. To meet this demand some manufacturers have developed high ESR components (e.g., ceramic capacitors). Unfortunately, due to the limited volume of these components they are significantly more expensive than conventional lower ESR components of the same general form factor and value (ten times or more increase in expense). This increase in expense has prevented some manufacturers from including these higher ESR components in their products even in instances where the higher ESR component offers a power delivery performance improvement.

DESCRIPTION OF THE EMBODIMENTS

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

Embodiments discussed herein can provide a way of increasing an ESR of a component using package vias with controlled resistivity. The increased ESR component can be created using higher volume, lower cost components than components with higher ESR prior to connection to a package. One or more embodiments can provide a component with an increased ESR at a fraction of the cost of purchasing a more expensive, low volume higher ESR component from a manufacturer.

Using controlled resistance vias connected between a pad and lower resistance substrate routing connection circuitry, the package can include extra resistance in series or parallel with the component, which can produce the same effect as manufacturing the component with a higher ESR. In one or more embodiments, the high resistance vias can be created by laser drilling the vias in two steps. In the first step, via holes corresponding to locations to be electrically coupled to a pad to be connected to a component with increased ESR are drilled into a surface of the substrate. The via holes are at least partially filled with a conductive polymer (e.g., a conductive epoxy) that is less conductive (i.e. more resistive) than the conductive material used to create the vias (e.g., copper, gold, etc.). The conductive polymer is electrically connected to the vias and fills the holes. A pad formed over the conductive polymer is electrically connected to the polymer. The pad can be electrically connected to the via, such as only through conductive polymer. An epoxy is a synthetic (thermosetting) polymer that includes chemicals or compounds in the epoxide group.

The vias to be filled with the conductive polymer can be selectively formed only in locations that benefit from the increased resistance, such as locations at which a lower ESR component will be electrically connected to increase the ESR of the component. The remaining polymer is then removed (e.g., etched), and another set of vias are formed and filled with conductive material that includes a resistance less than the resistance of the conductive polymer. The ESR of the components can be controlled by selecting the conductive polymer used to fill the vias as well as the number of vias and orientation of the conductive polymer filled vias (e.g., series and/or parallel connections) that are connected to each pad.

Figure 1A:
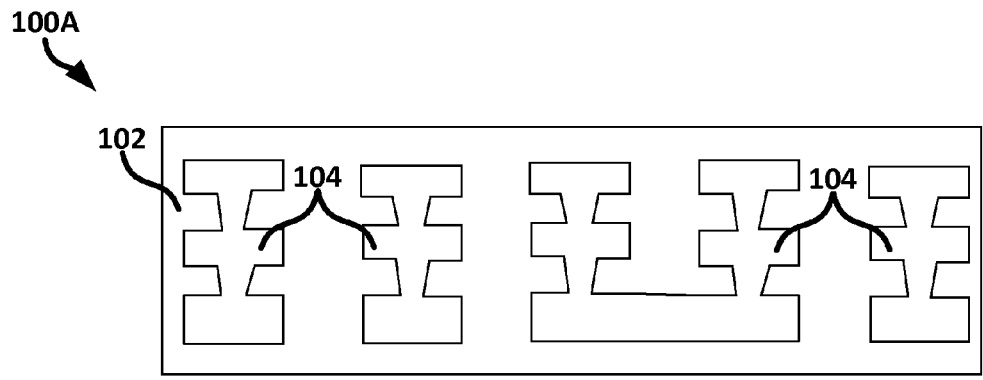
FIGS. 1A-1J illustrate, by way of example, cross-section diagrams of an embodiment of a process for controlling an ESR of a component.

FIGS. 1A, 1B, 1C, 1D, 1E, 1F, 1G, 1H, 1I, and 1J illustrate, by way of example, a process for making a device that includes a component with an increased ESR. FIG. 1A illustrates, by way of example, a device 100A that includes a substrate 102 built-up to the base-1 layer. The substrate 102 can include a die buildup, package buildup (e.g., ajinomoto buildup), a printed circuit board (PCB) layer buildup (e.g., FR-4), a flexible device buildup (e.g., polyimide), and so forth.

Figure 1B:
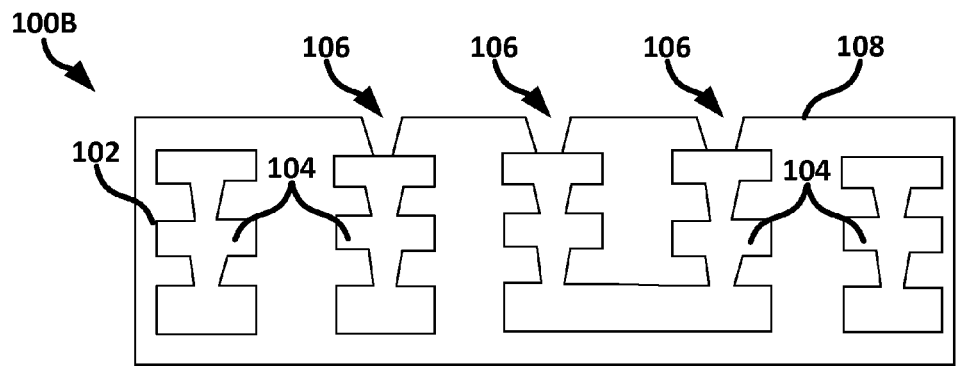

The built-up substrate 102 includes electrical connection circuitry 104 (e.g., pads, vias, and other metallization for conducting electricity) therein. The device 100B of FIG. 1B illustrates, by way of example, the device 100A with one or more via holes 106. The via holes 106 as illustrated extend from a top surface 108 of the substrate to electrical connection circuitry 104. The via holes 106 are contiguous with the electrical connection circuitry 106. The via holes 106 can be formed using a laser, a mechanical, and/or a chemical substrate removal process.

Figure 1C:
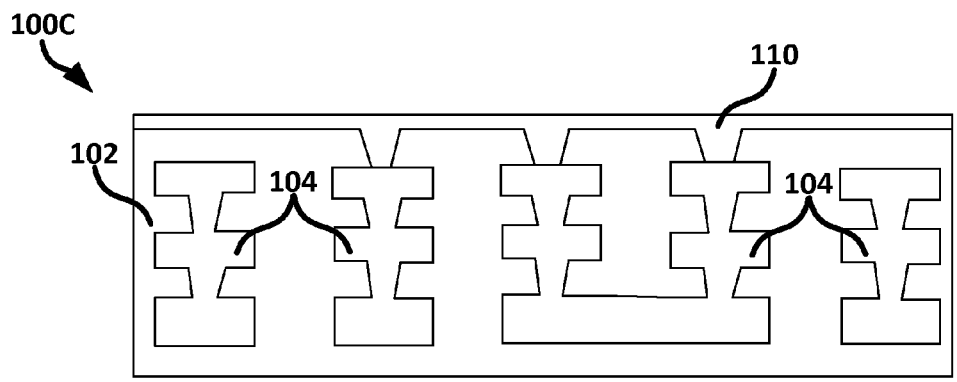

FIG. 1C illustrates, by way of example, the device 100B with a conductive polymer material 110 (e.g., a conductive epoxy) situated in the via holes 106 and on the surface 108 of the substrate 102. The conductive polymer material 110 can include a conductivity that is less than (or a resistivity that is greater than) the conductivity of the electrical connection circuitry 104. The conductivity (resistivity) of the conductive polymer can be chosen based on an amount of resistance needed to increase the effective series resistance (ESR) of a component to be electrically coupled thereto. The ESR can be chosen to help dampen a ringing of a power circuit, for example, or provide a more precise oscillating frequency in a resistor capacitor oscillator circuit, among other applications.

There are many varieties of conductive polymer with a variety of conduction and curing characteristics. For example, epoxies can include a resistance value from fractions of an Ohm per meter to high resistance values, such as thousands or millions of Ohms per meter, or more. Since the resistance values of the conductive epoxies is dependent on the amount of the conductive polymer through which the current flows, the resistance of a particular pool of polymer can be controlled by the area or volume which it consumes. Thus, the resistance of the polymer is dependent on the dimension(s) (e.g., depth, length, width, shape, and so forth) of the hole 106 which the polymer consumes.

Epoxies can be cured at a variety of temperatures, some of which require extra processing to heat the polymer to a temperature at which the polymer hardens. Some epoxies cure at ambient temperature making these epoxies easier to cure. The materials which make up epoxies generally include a conductive material mixed with a binder. These materials affect the resistivity and curing properties of the polymer. Example conductive materials that can be used to make an polymer include graphite, carbon, gold, silver, aluminum, nickel, titanium, platinum, and copper, combinations or compounds thereof, or other conductive material. Example binder materials that can be used to make an polymer include thermo-plastic resins, gel, cellulose resin, flouroelastomer resin, acrylic, putty, lacquer, silicate, polymer, ink, grease, combinations or compounds thereof, or other binding agent. With this wide variability, a conductive polymer and a hole volume can be chosen to match nearly all, if not all, possible resistance values (except negative resistance values or values corresponding to a greater conductivity value than the electrical connection circuitry in the substrate).

Figure 1D:
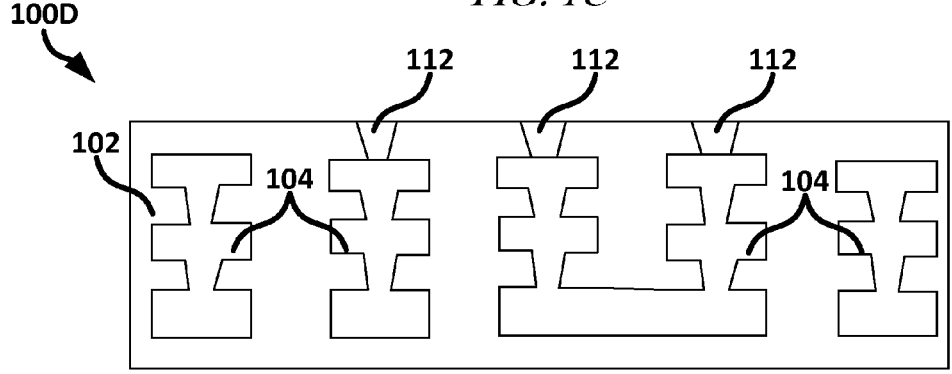
Figure 1E:
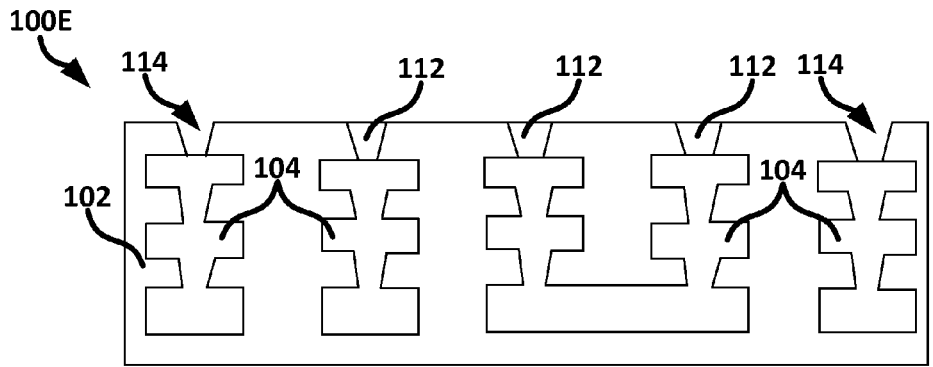

The conductive polymer 110 can be cured and portions of the polymer 110 can be removed, such as to leave polymer 112 in areas corresponding to the holes 106, such as is shown in the illustrative example device 100D of FIG. 1D. The polymer 110 can be removed using a mechanical or chemical removal process, such as a chemical etch or a mechanical strip process. FIG. 1E illustrates, by way of example, a device 100E that includes the device 100D with second via holes 114 formed therein. The via holes 114 can be at locations in which conductive material, such as the same conductive material that was used to form the electrical connection circuitry (e.g., copper, aluminum, gold, silver, tantalum, combinations thereof, compounds thereof, and so forth) will be situated.

Figure 1F:
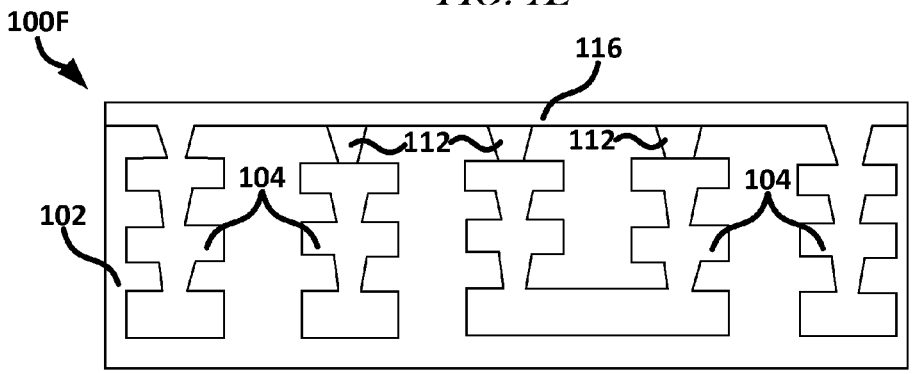
Figure 1G:
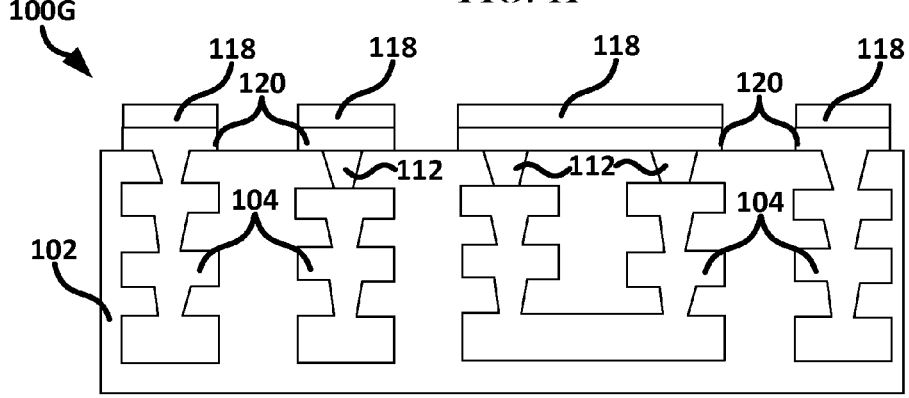

The device 100F of FIG. 1F illustrates, by way of example, the device 100E with a conductive material 116 situated in the holes 114, on the surface 108 of the substrate 102, and on the conductive polymer 112. FIG. 1G illustrates, by way of example, the device 100G that includes the device 100F after a conductive material process has removed portions of the conductive material 116 to form the pads 120. The device 100G includes an etch resist material 118 on portions of the conductive material, such as to protect the conductive material from being removed in the etch process. While the FIGS. 1F and 1G illustrate a subtractive process for forming electrical connection circuitry (e.g., the pads 120), it will be understood that a semi-additive, spallation, or other process can be used to form the electrical connection circuitry (e.g., the circuitry 104 and/or the pads 120).

Figure 1H:
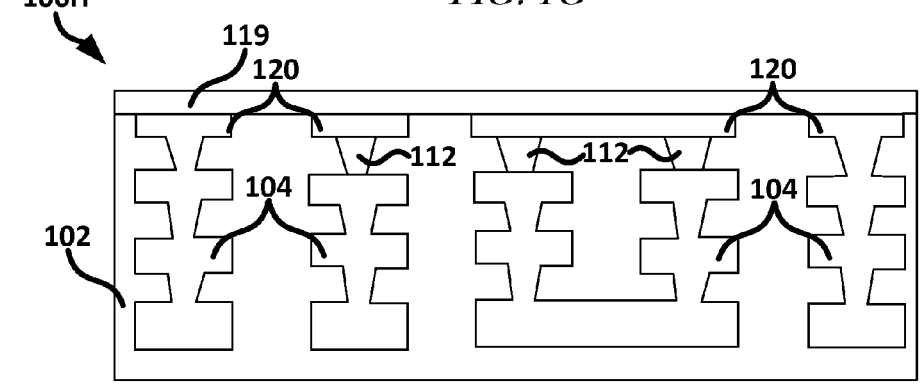
Figure 1I:
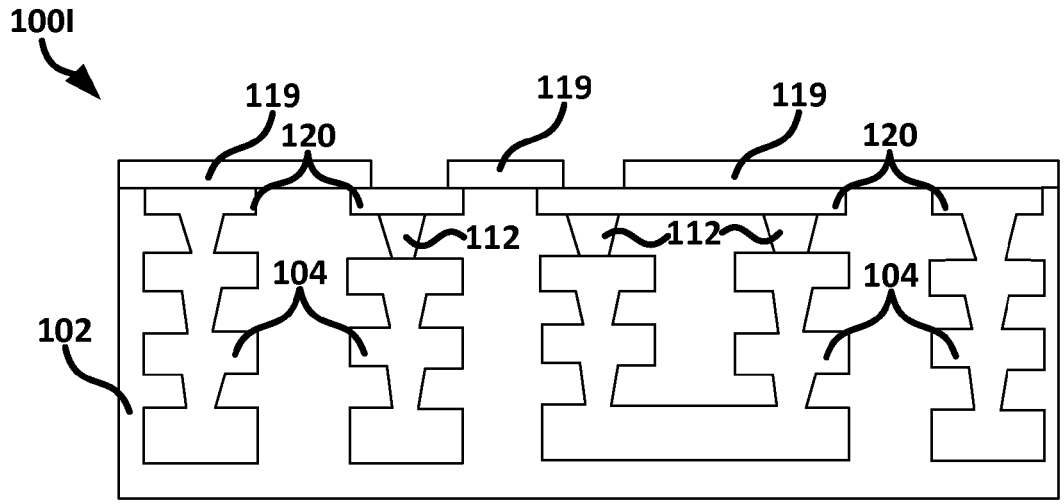

FIG. 1H illustrates, by way of example, a device 100H that includes the device 100G with the etch resist material 118 removed from the pads 120, the substrate 102 built up between the pads 120, and a solder resist material 119 on the substrate 102 and the pads 120 (e.g., portions of the interconnect circuitry 104). The etch resist material 118 can be removed using a mechanical and/or chemical removal process, such as to strip the etch resist material 118 from the pads 120. FIG. 1I illustrates, by way of example, a device 100I that includes the device 100H with portions of the solder resist material 119 patterned so as to expose a portion of the pads 120. The solder resist material 119 can be removed using a mechanical process, chemical process, or other solder resist material removal process.

Figure 1J:
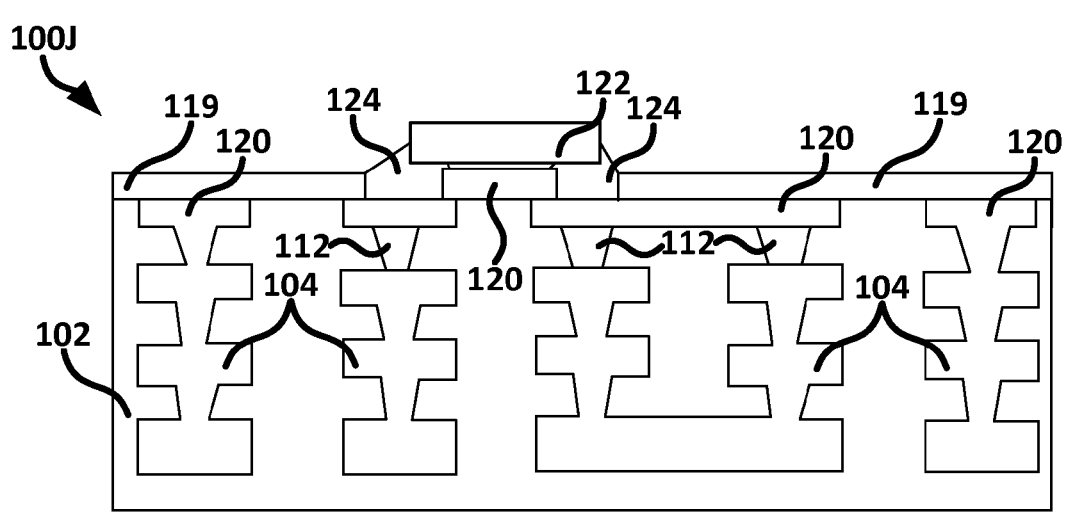

FIG. 1J illustrates, by way of example, a device 100J that includes the device 100I with a component 122 attached and electrically connected to pads 120 by a conductive adhesive 124. The component 122 is an electric or electronic component, such as can include a resistor, inductor, capacitor, transistor, die, logic gate, oscillator, power supply, voltage or current regulator, diode, switch, and so forth. The ESR of the component is increased by virtue of the electrical connection to the conductive polymer 112. In the example of the device 100H the component is coupled to three vias filled with the conductive polymer 112. A first leg of the component is in series with a single via hole filled conductive polymer and the second leg of the component 122 is in series with two vias holes filled with conductive polymer that provide parallel paths for current to flow. The ESR of the component 122 is thus increased by R1+(R2*R3/(R2+R3)), where R1 is resistance of the conductive polymer 112 connected to the first leg and R2 and R3 are the resistances of the conductive epoxies 112 connected to the second leg, respectively.

While the FIGS. illustrate only a singly component connected to a layer of the substrate 102, multiple components can be connected on such a layer. The components can be electrically connected to each other through the electrical connection circuitry 104.

By adjusting the size of the via holes in which conductive polymer will be situated, the material from which the conductive polymer is formed, and the configuration of the via holes relative to one another (e.g., series and/or parallel electrical paths between the via holes), the ESR of the component electrically coupled thereto can be adjusted. While the FIGS. 1A-H illustrate the process as including only a single conductive polymer deposit, multiple, separate conductive polymer deposit, cure, and removal operations can be performed, such as to deposit multiple types of conductive polymer on a single substrate. Such a process can include performing the operations shown in FIGS. 1A-E, then filling the via holes with a different conductive polymer, curing the conductive polymer, and removing excess conductive polymer, such as is similarly shown in FIGS. 1C-1E. The device can then be processed in accord with the operations described with regard to FIGS. 1F-1H. Devices that include two different conductive epoxies are illustrated in FIGS. 2A and 2B as examples.

Figure 2A:
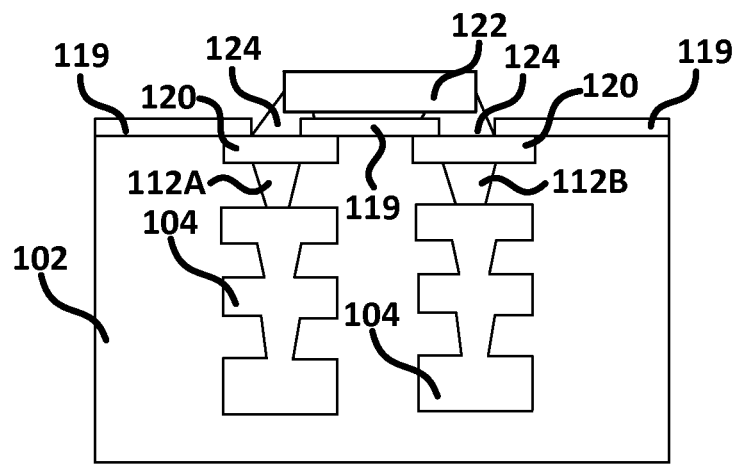
FIG. 2A illustrates, by way of example, a cross-section diagram of an embodiment of a component electrically coupled to multiple conductive epoxies to control the ESR of the component.

FIG. 2A illustrates, by way of example, a device 200A that includes the substrate 102, electrical connection circuitry 104, solder resist 119, pads 120, conductive adhesive 124 (e.g., a paste, solder, tape, and so forth), and the component 122. The device 200A includes a first type of conductive polymer 112A electrically connected between the pad 120 and the electrical connection circuitry 104 connected to a first leg of the component 122. As used herein a leg of a component refers to an electrical connection point, it does not have to be a physical leg. For example, a surface mount resistor generally has two connection points on opposing sides of the resistor. Each of these connection points is considered a leg. The device 200A includes a second type of conductive polymer 112B electrically connected between the pad 120 and the electrical connection circuitry 104 connected to a second leg of the component 122. The ESR of the component 122 is increased by R4+R5, where R4 is the resistance of the conductive polymer 112A and R5 is the resistance of the conductive polymer 112B.

Figure 2B:
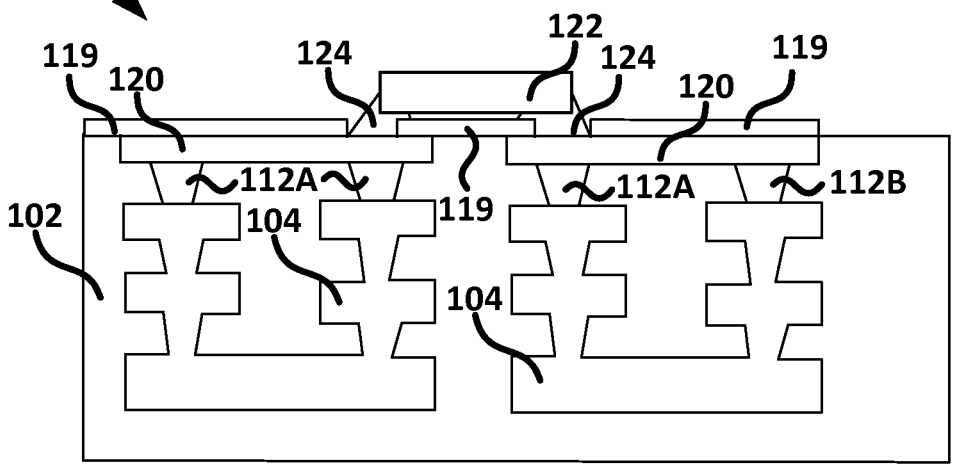
FIG. 2B illustrates, by way of example, a cross-section diagram of another embodiment of a component electrically coupled to multiple conductive epoxies to control the ESR of the component.

FIG. 2B illustrates, by way of example, a device 200B that includes the substrate 102, electrical connection circuitry 104, solder resist 119, pads 120, conductive adhesive 124 (e.g., a conductive paste, solder, tape, and so forth), and the component 122. The device 200B includes the first type of conductive polymer 112A electrically connected between the pad 120 and the electrical connection circuitry 104 connected to a first leg of the component 122. The device 200B includes the second type of conductive polymer 112B and the first type of conductive polymer 112A electrically connected between the pad 120 and the electrical connection circuitry 104 connected to a second leg of the component 122. The conductive epoxies 112A electrically coupled to the first leg of the component are electrically in parallel with each other and so are the conductive epoxies 112A and 112B electrically coupled to the second leg of the component 122. The ESR of the component 122 is increased by $((R4*R4)/2R4)+((R4*R5)/(R4+R5))$.

While the FIGS. 1A-1H and 2A-2B illustrate devices that include component attach circuitry (pads) on only one side thereof, the methods illustrated apply equally to devices that include component attach circuitry on both sides of the substrate. A device that includes conductive polymer on both sides of the device substrate is illustrated in FIG. 3.

Figure 3:
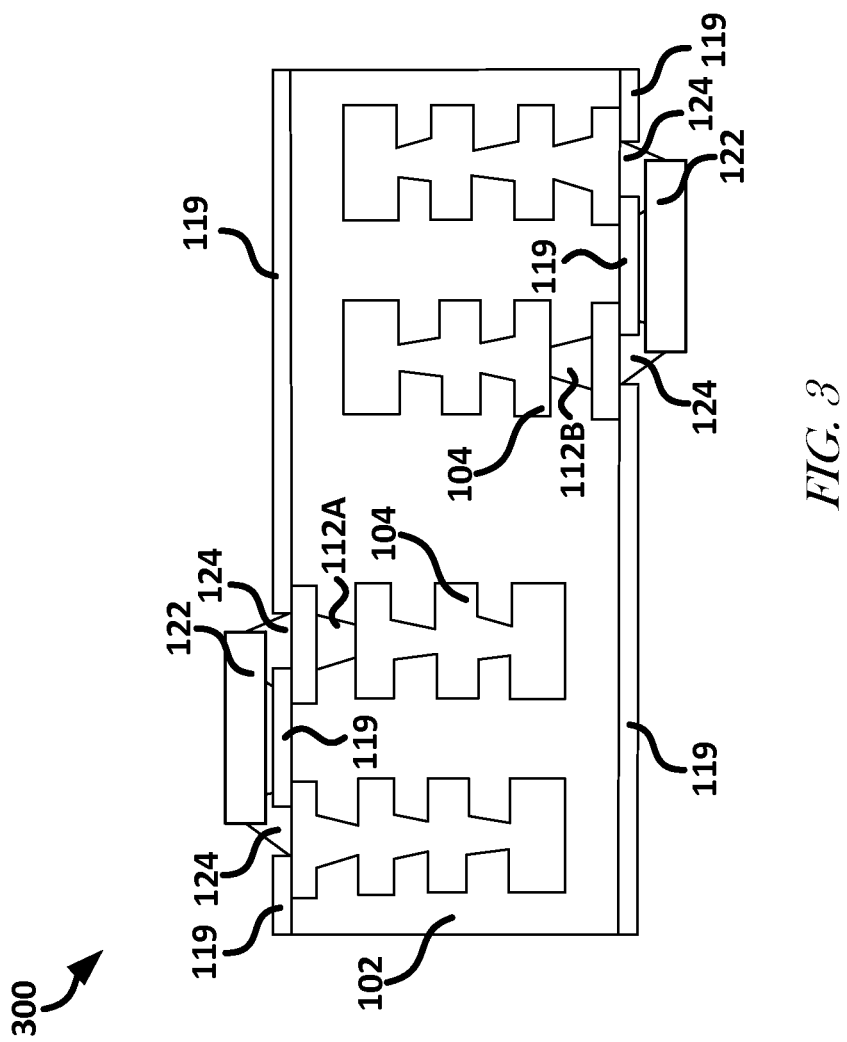
FIG. 3 illustrates, by way of example, a cross-section diagram of another embodiment of components electrically coupled to multiple conductive epoxies to control the ESR of the components.

FIG. 3 illustrates, by way of example, a cross-section diagram of an embodiment of a device 300 that includes the conductive polymer 112A and 112B electrically connected to opposite sides of the substrate 102. The conductive polymer 112A and 112B can be deposited (e.g., simultaneously) in the same manner as the polymer 112. In forming the device 300, the substrate can be built up to the base-1 layer, similar to the device 100A. The holes in which conductive polymer 112A and 112B will be situated can be formed (e.g., simultaneously), the conductive polymer can be deposited and cured, excess polymer can be removed, and the trace and buildup processes can be performed to finish forming the device.

Generally described herein are manufacturing process flows and devices for altering an ESR of a component. In summary, a substrate is built-up to the base-1 layer (or other layer at which the conductive polymer will reside). A few discrete via hole drilling processes are performed, one for drilling via holes to be filled with conductive polymer and another for drilling via holes to be filled with conductive material that has a lower resistivity than the conductive polymer. The first hole drilling process includes only drilling the holes to be filled with conductive polymer (e.g., for ESR decoupling). The panel or strip is then taken to an polymer process where the holes are filled with a conductive polymer. In one or more embodiments, a copper or silver based polymer is used. The resistance of the conductive polymer can be tuned to a desired value. The conductive polymer is then cured, such as by exposing the polymer to a higher temperature or letting the polymer cure in ambient temperature. Excess polymer is etched, such as to leave only the via holes filled with conductive polymer. At this point the panel or strip is brought back to the via drilling line, and the rest of the vias (e.g., on both top and bottom layers) are drilled. At this point, fabrication continues normally, with patterning of the surface and base layers, solder resist, microball, and component attach. The conductivity of the polymer can be targeted based on the desired ESR of the component being used. Control of individual component's ESR can be achieved by altering the number of higher resistance vias (i.e. vias filled with conductive polymer) connected to a pad, and choosing to connect one pad or both pads with higher resistance vias.

Figure 4:
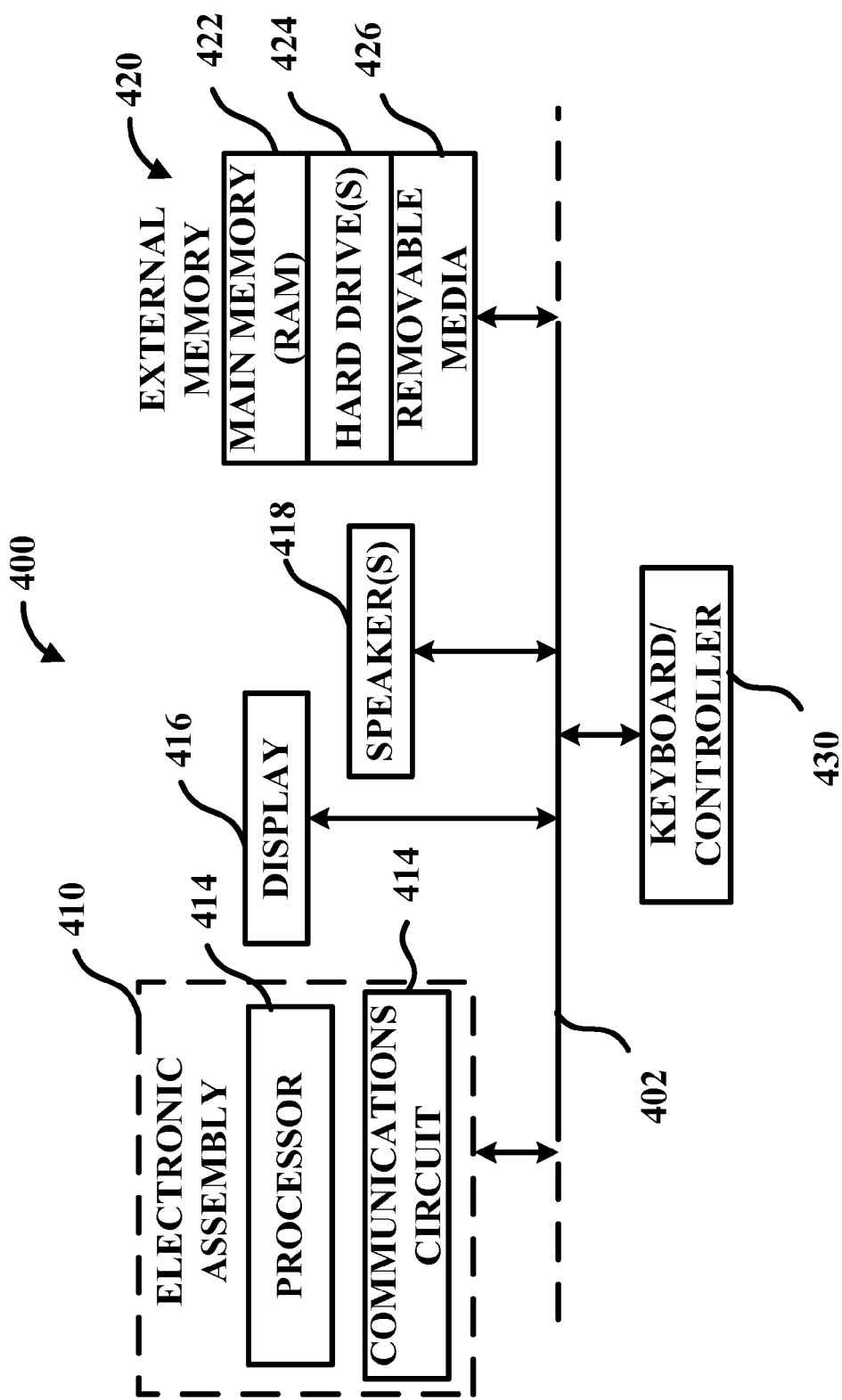
FIG. 4 shows a block diagram example of an electronic device which can include a component with a controlled ESR as disclosed herein.

FIG. 4 shows a block diagram example of an electronic device which can include a higher resistance via as disclosed herein. An example of an electronic device using one or more packages with one or more higher resistance via is included to show an example of a device application for the present disclosure. FIG. 4 shows an example of an electronic device 400 incorporating an inorganic interposer. Electronic device 400 is merely one example of a device in which embodiments of the present disclosure can be used. Examples of electronic devices 400 include, but are not limited to, personal computers, tablet computers, supercomputers, servers, telecommunications switches, routers, mobile telephones, personal data assistants, MP3 or other digital music players, radios, etc. In this example, electronic device 400 comprises a data processing system that includes a system bus 402 to couple the various components of the system. System bus 402 provides communications links among the various components of the electronic device 400 and can be implemented as a single bus, as a combination of busses, or in any other suitable manner.

An electronic assembly 410 is coupled to system bus 402. The electronic assembly 410 can include a circuit or combination of circuits. In one embodiment, the electronic assembly 410 includes a processor 412 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 910 are a custom circuit, an application-specific integrated circuit (ASIC), or the like, such as, for example, one or more circuits (such as a communications circuit 414) for use in wireless devices like mobile telephones, pagers, personal data assistants, portable computers, two-way radios, and similar electronic systems. The IC can perform any other type of function.

The electronic device 400 can include an external memory 420, which in turn can include one or more memory elements suitable to the particular application, such as a main memory 422 in the form of random access memory (RAM), one or more hard drives 424, and/or one or more drives that handle removable media 426 such as compact disks (CD), digital video disk (DVD), and the like.

The electronic device 400 can also include a display device 416, one or more speakers 418, and a keyboard and/or controller 430, which can include a mouse, trackball, touch screen, voice-recognition device, or any other device that permits a system user to input information into and receive information from the electronic device 400.

Additional Notes and Examples

In Example 1 a device can include a substrate including electrical connection circuitry (e.g., vias, pads, traces, buses, or other metallization) therein, a first via hole through a first surface of the substrate and contiguous with the electrical connection circuitry, a first conductive polymer with a resistance greater than a resistance of the electrical connection circuitry filling the first via hole, and a component electrically coupled to the first conductive polymer.

In Example 2, the device of Example 1 includes a first conductive pad electrically connected between the component and the first conductive polymer.

In Example 3, the device of at least one of Examples 1-2 includes a second conductive pad, wherein the component is electrically coupled to the connection circuitry through the second conductive pad.

In Example 4, the device of Example 3 includes a second via hole through the first surface of the substrate and contiguous with the connection circuitry, wherein the first conductive polymer further fills the second via hole and wherein the second conductive pad is electrically connected between the component and the first conductive polymer.

In Example 5, the device of Example 4 includes a third via hole through the first surface of the substrate and contiguous with the connection circuitry, wherein the first conductive polymer further fills the third via hole, wherein the filled second via hole and the filled third via hole are electrically in parallel, and wherein the second conductive pad is further electrically connected to the filled third via hole.

In Example 6, the device of Example 5 includes a fourth via hole through the first surface of the substrate and contiguous with the connection circuitry, wherein the first conductive polymer further fills the fourth via hole, wherein the filled fourth via hole and filled first via hole are electrically in parallel, and wherein the first conductive pad is further electrically connected to the filled fourth via hole.

In Example 7, the device of at least one of Example 3 includes a second via hole through the first surface of the substrate and contiguous with the connection circuitry, and a second conductive polymer different from the first conductive polymer, with a resistance greater than the resistance of the connection circuitry, and filling the second via hole, and wherein the second conductive pad is electrically connected between the component and the second conductive polymer.

In Example 8, the device of Example 7 includes a third via hole through the first surface of the substrate and contiguous with the connection circuitry, wherein the first conductive polymer further fills the third via hole, wherein the filled second via hole and the filled third via hole are electrically in parallel, and wherein the second conductive pad is further electrically connected to the filled third via hole.

In Example 9, the device of Example 7 includes a third via hole through the first surface of the substrate and contiguous with the connection circuitry, wherein the second conductive polymer further fills the third via hole, wherein the filled second via hole and the filled third via hole are electrically in parallel, and wherein the second conductive pad is further electrically connected to the filled third via hole.

In Example 10, the device of at least one of Examples 1-9 includes, wherein the component is a capacitor.

In Example 11 a method of making a device with a component with an increased effective series resistance (ESR) includes drilling a first set of via holes in a surface of a substrate, the substrate including electrical connection circuitry therein, situating a first conductive polymer in the first set of via holes and on the substrate, the first conductive polymer including a resistance greater than a resistance of the connection circuitry, removing excess first conductive polymer from the substrate, drilling a second set of via holes in the surface of the substrate, situating a conductive material with a resistance less than a resistance of the first conductive polymer in the second set of via holes and on the substrate, including situating the conductive material on the first conductive polymer, and electrically connecting a component to the conductive material so as to electrically couple the component to the first conductive polymer.

In Example 12, the method of Example 11 includes curing the first conductive polymer prior to removing excess first conductive polymer.

In Example 13, the method of at least one of Examples 11-12 includes patterning the conductive material to form pads such that each via hole of the first set of via holes includes a pad of the pads thereon.

In Example 14, the method of Example 13 includes, wherein at least one pad of the pads is electrically connected to two via holes of the first set of via holes, and wherein the two via holes are electrically in parallel.

In Example 15, the method of Example 13 includes, wherein the component is electrically connected to two pads and wherein each pad of the two pads is electrically connected to a first via hole of the first set of via holes.

In Example 16, the method of at least one of Examples 11-15 includes drilling a third set of via holes in the substrate, situating a second conductive polymer different from the first conductive polymer in the third set of via holes and on the substrate, the second conductive polymer including a resistance greater than the resistance of the electrical connection circuitry, and removing excess first conductive polymer from the substrate before drilling the second set of via holes in the substrate.

In Example 17 a device can include a substrate including electrical connection circuitry therein, a first via hole through a first surface of the substrate and contiguous with the electrical connection circuitry, a second via hole through a second surface of the substrate opposite the first surface, the second via hole contiguous with the electrical connection circuitry, a first conductive polymer with a resistance greater than a resistance of the electrical connection circuitry filling at least one of the first and second via holes, and a component electrically coupled to the first conductive polymer.

In Example 18, the device of Example 17 includes, wherein the component is a first component, the first conductive polymer fills the first via hole, and the device further comprises a second conductive polymer, different from the first conductive polymer filling the second via hole, the second conductive polymer with a resistance greater than the resistance of the electrical connection circuitry, and a second component electrically coupled to the second conductive polymer.

In Example 19, the device of Example 17 includes, wherein the first conductive polymer fills the first via hole and the device further comprises a third via hole through the first surface of the substrate and contiguous with the electrical connection circuitry, wherein the third via hole is filled with the first conductive polymer or a second conductive polymer, the second conductive polymer with a resistance greater than the resistance of the electrical connection circuitry, and wherein the component is further electrically coupled to the electrical connection circuitry through the first or second conductive polymer in the third via hole.

In Example 20, the device of Example 19 includes, wherein the filled first and third via holes are electrically in parallel or series.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
a substrate including first, second, and third layers, the second layer between the first and third layers, the first layer including metal vias therethrough and the second layer including metal electrical connection circuitry contiguous with the metal vias;
first and second via holes through a first surface of the third layer of the substrate and contiguous with the electrical connection circuitry;
a first conductive polymer with a resistance greater than a resistance of the electrical connection circuitry and the metal vias completely filling the first via hole, with only the first conductive polymer in the first via hole;
a second conductive polymer with a resistance greater than a resistance of the electrical connection circuitry and a different resistance than the first conductive polymer in the second via hole;
a first conductive pad contiguous with the first and second conductive polymers; and
a component electrically coupled to the first and second conductive polymers through the first conductive pad.

2. The device of claim 1, further comprising a second conductive pad, wherein the component is electrically coupled to the connection circuitry through the second conductive pad.

3. The device of claim 2, further comprising a third via hole through the first surface of the substrate and contiguous with the connection circuitry, wherein the first conductive polymer further fills the third via hole and wherein the second conductive pad is electrically connected between the component and the first conductive polymer in the third via hole.

4. The device of claim 3, further comprising a fourth via hole through the first surface of the substrate and contiguous with the connection circuitry, wherein the first conductive polymer further fills the fourth via hole, wherein the filled third via hole and the filled fourth via hole are electrically in parallel, and wherein the second conductive pad is further electrically connected to the filled fourth via hole.

5. The device of claim 4, further comprising a fifth via hole through the first surface of the substrate and contiguous with the connection circuitry, wherein the first conductive polymer further fills the fifth via hole, wherein the filled fifth via hole and filled first via hole are electrically in parallel, and wherein the first conductive pad is further electrically connected to the filled fifth via hole.

6. The device of claim 2, further comprising a third via hole through the first surface of the substrate and contiguous with the connection circuitry, and the second conductive polymer filling the third via hole, and wherein the second conductive pad is electrically connected between the component and the second conductive polymer.

7. The device of claim 6, further comprising a fourth via hole through the first surface of the substrate and contiguous with the connection circuitry, wherein the first conductive polymer further fills the fourth via hole, wherein the filled third via hole and the filled fourth via hole are electrically in parallel, and wherein the second conductive pad is further electrically connected to the filled fourth via hole.

8. The device of claim 6, further comprising a fourth via hole through the first surface of the substrate and contiguous with the connection circuitry, wherein the second conductive polymer further fills the fourth via hole, wherein the filled third via hole and the filled fourth via hole are electrically in parallel, and wherein the second conductive pad is further electrically connected to the filled fourth via hole.

9. The device of claim 1, wherein the component is a capacitor.

10. A device comprising:
a substrate including electrical connection circuitry therein;
a first via hole through a first surface of the substrate and contiguous with the electrical connection circuitry;
a second via hole through a second surface of the substrate opposite the first surface, the second via hole contiguous with the electrical connection circuitry;
a first conductive polymer with a resistance greater than a resistance of the electrical connection circuitry completely filling at least one of the first and second via holes, with the at least one of the first and second via holes including only the first polymer therein;

a first component electrically coupled to the first conductive polymer, an active region of the first component facing a first direction; and a second component electrically coupled to the connection circuitry, an active region of the second component facing a second direction opposite the first direction.

11. The device of claim 10, wherein the first conductive polymer fills the first via hole, and the device further comprises:

a second conductive polymer, different from the first conductive polymer filling the second via hole, the second conductive polymer with a resistance greater than the resistance of the electrical connection circuitry; and the second component electrically coupled to the second conductive polymer.

12. The device of claim 10, wherein the first conductive polymer fills the first via hole and the device further comprises:

a third via hole through the first surface of the substrate and contiguous with the electrical connection circuitry;

wherein the third via hole is filled with the first conductive polymer or a second conductive polymer, the second conductive polymer with a resistance greater than the resistance of the electrical connection circuitry; and wherein the first component is further electrically coupled to the electrical connection circuitry through the first or second conductive polymer in the third via hole.

13. The device of claim 12, wherein the filled first and third via holes are electrically in parallel or series.

\* \* \* \* \*